US008685265B2

(12) United States Patent
Nakao et al.

(10) Patent No.: US 8,685,265 B2
(45) Date of Patent: Apr. 1, 2014

(54) MANUFACTURING METHOD OF SEMICONDUCTOR DEVICE AND SEMICONDUCTOR MANUFACTURING APPARATUS

(75) Inventors: Yoshiyuki Nakao, Yokohama (JP); Kazuo Hashimi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 21 days.

(21) Appl. No.: 13/469,707

(22) Filed: May 11, 2012

(65) Prior Publication Data

US 2012/0288969 A1   Nov. 15, 2012

(30) Foreign Application Priority Data

May 12, 2011 (JP) .................................. 2011-107025

(51) Int. Cl.
 *H01L 21/302* (2006.01)
(52) U.S. Cl.
 USPC ............ 216/59; 216/60; 438/9; 257/E21.528; 156/345.24; 156/345.25; 700/121
(58) Field of Classification Search
 None
 See application file for complete search history.

(56) References Cited

U.S. PATENT DOCUMENTS

| 2004/0045934 A1* | 3/2004 | Harvey et al. .................... 216/60 |
| 2004/0241928 A1 | 12/2004 | Maruyama et al. |
| 2009/0029489 A1* | 1/2009 | Park et al. ......................... 438/9 |
| 2009/0253222 A1 | 10/2009 | Morisawa et al. |
| 2010/0029177 A1* | 2/2010 | Kobayashi et al. ............... 451/5 |
| 2011/0315661 A1 | 12/2011 | Morisawa et al. |

FOREIGN PATENT DOCUMENTS

| JP | 2004-235361 A | 8/2004 |
| JP | 2006-013013 A | 1/2006 |
| JP | 2009-252945 A | 10/2009 |
| JP | 2010-219263 A | 9/2010 |

* cited by examiner

*Primary Examiner* — Lan Vinh
*Assistant Examiner* — Jiong-Ping Lu
(74) *Attorney, Agent, or Firm* — Westerman, Hattori, Daniels & Adrian, LLP

(57) ABSTRACT

An etching apparatus includes a process unit and a control unit. Emission intensity of plasma inside the process unit is obtained by an OES detector, a nonlinear regression analysis is performed by an etching control device to determine a regression formula. The nonlinear regression analysis is performed by using the emission intensity of the plasma obtained until a first time when the emission intensity of the plasma passes a peak, and a second time to be an etching end point is calculated by using the regression formula. The etching end point is calculated as a time when the emission intensity decreases for a predetermined value from the first time. The etching apparatus finishes an etching when the process reaches the etching end point. It is thereby possible to control the etching end point with high-accuracy.

11 Claims, 12 Drawing Sheets

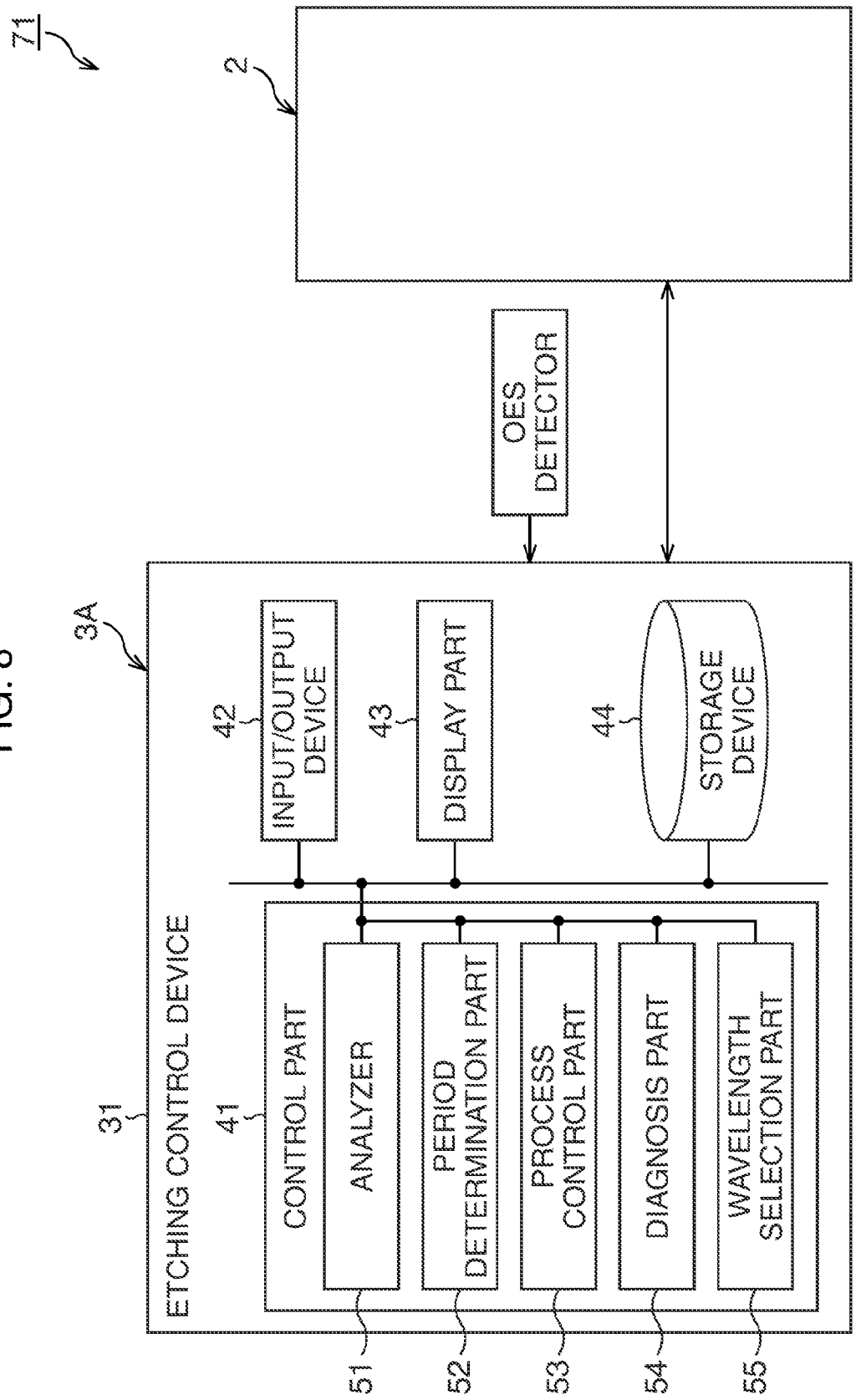

MANUFACTURING METHOD OF SEMICONDUCTOR DEVICE AND SEMICONDUCTOR MANUFACTURING APPARATUS

CROSS-REFERENCE TO RELATED APPLICATION

This application is based upon and claims the benefit of priority of the prior Japanese Patent Application No. 2011-107025, filed on May 12, 2011, the entire contents of which are incorporated herein by reference.

FIELD

The embodiments discussed herein are directed to a manufacturing method of a semiconductor device and a semiconductor manufacturing apparatus.

BACKGROUND

When a thin film on a semiconductor wafer is etched by plasma, it is necessary to correctly detect an end point of the etching to prevent a shortage of etching and overetching. The end point of the etching is able to be determined by observing a change of emission intensity of plasma by using a spectroscope.

For example, when a patterning is performed for an insulating film formed on an etching stopper film by the etching, the etching stopper film at a lower layer is exposed when the insulating film is removed by the etching. At this time, plasma with a wavelength resulting from the etching stopper film begins to be generated in an etching apparatus. Accordingly, it is possible to judge the end point of the etching of the insulating film from a change of the emission intensity of the wavelength if an emission wavelength of the plasma generated at the etching time of the etching stopper film is examined in advance.

Here, there is a case when light-emission of plasma with plural wavelengths is measured to correctly detect the etching end point. The emission wavelengths of the plasma to be measured are determined in accordance with the following processes. At first, the emission intensities of the plasma with plural wavelengths are obtained by performing the etching processes for one time or more. Subsequently, waveforms of the emission intensities of the plural wavelengths are cluster analyzed, and plural groups are classified based on resemblance of waveforms. Further, a representative wavelength is selected from each group. The end point of the etching is determined by examining changes of the emission intensities of the representative wavelengths selected as stated above.

[Patent Document 1] Japanese Laid-open Patent Publication No. 2004-235361

[Patent Document 2] Japanese Laid-open Patent Publication No. 2010-219263

However, when the end point is judged by the emission intensity of the plasma emission wavelength resulting from the insulating film and the etching stopper film, there is a possibility in which the overetching and the shortage of etching occur because the end point is judged after the change of the emission intensity is observed.

Besides, it becomes impossible to correctly detect a variation of the emission intensity of the plasma and therefore to correctly detect the etching end point when a part of data lacks, or noises mix into the data from external. Further, it is impossible to correctly detect the variation of the emission intensity of the plasma, and to correctly detect the end point of the etching when a value of a part of data changes discontinuously.

SUMMARY

According to an aspect of the embodiment, a manufacturing method of a semiconductor device, including: exposing an etching object to plasma and starting etching of the etching object; obtaining emission intensity of the plasma and determining a first time when a sign of a time differentiation of the emission intensity of the plasma changes; performing a nonlinear regression analysis by using the emission intensity of the plasma obtained up to the first time, and finding a regression formula of a time change of the emission intensity of the plasma; finding a second time finishing the etching from the regression formula after the first time; and finishing the etching at the second time, is provided.

Besides, according to another aspect of the embodiment, a semiconductor manufacturing apparatus including: a chamber capable of housing an etching object, and having electrodes generating plasma; an emission spectral detector obtaining emission intensity of the plasma; and a control unit finding a regression formula of a time change of the emission intensity by using a nonlinear regression analysis and determining a finish time of an etching, wherein the control unit determines a first time when a sign of a time differentiation of the emission intensity of the plasma changes, finds a second time finishing the etching from the regression formula after the first time, and finishes the etching at the second time, is provided.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a block diagram illustrating an example of a semiconductor manufacturing apparatus according to a second embodiment of the present invention;

DESCRIPTION OF EMBODIMENTS

Hereinafter, embodiments of the present invention will be explained with reference to accompanying drawings.

First Embodiment

Figure 1:
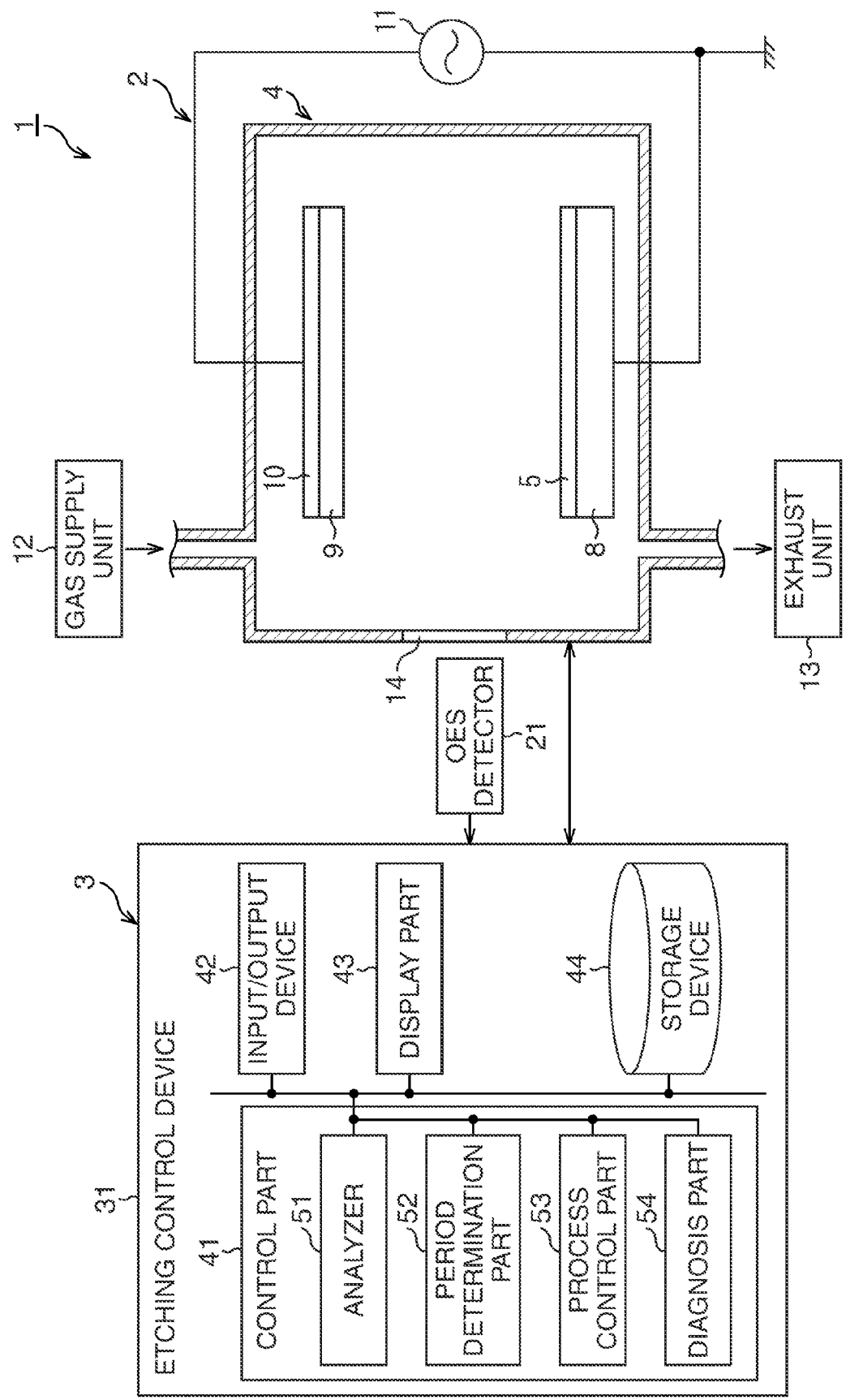
FIG. 1 is a block diagram illustrating an example of a semiconductor manufacturing apparatus according to a first embodiment of the present invention.

FIG. 1 illustrates a schematic configuration of a semiconductor manufacturing apparatus.

An etching apparatus 1 is a semiconductor manufacturing apparatus, and includes a process unit 2 and a control unit 3. The process unit 2 includes a chamber 4 capable of housing a silicon substrate 5. The chamber 4 is manufactured by, for example, an aluminum alloy. A lower electrode 8 placing the silicon substrate 5 in which a semiconductor device is manufactured and an upper electrode 9 disposed at upward of the silicon substrate 5 are included in the chamber 4.

The lower electrode 8 functions also as, for example, an electrostatic chuck suction holding the silicon substrate 5. A not-illustrated gap is formed between a part holding the silicon substrate 5 and the silicon substrate 5 at the lower electrode 8, and heat of the silicon substrate 5 is let out to the lower electrode 8 by introducing helium gas into the gap. A not-illustrated flow path is formed inside the lower electrode 8, and a temperature of the lower electrode 8 is kept at a predetermined value by letting a cooling fluid flow in the flow path.

The upper electrode 9 is manufactured by a material excellent in electric conductivity and thermal conductivity, for example, such as silicon, carbon, and alumina. The upper electrode 9 is supported by, for example, a supporter 10 made of aluminum. The upper electrode 9 is temperature controlled for stability of plasma and preventing over temperature of the upper electrode 9. A cooling liquid is flowed inside the supporter 10 for the temperature control of the upper electrode 9.

The lower electrode 8 and the upper electrode 9 are connected to a high-frequency power supply 11. A unit capable of outputting high-frequency of, for example, 400 MHz, 13.56 MHz, 27.12 MHz, 60 MHz is used for the high-frequency power supply 11. Besides, a gas supply unit 12 and an exhaust unit 13 are connected to the chamber 4. Further, an observation window 14 is provided at a side surface of the chamber 4. Here, a discharge method, shape, disposition, materials of the process unit 2 are not limited to those illustrated in FIG. 1.

The control unit 3 includes an OES (Optical Emission Spectroscopy) detector 21 and an etching control device 31. The OES detector 21 is disposed in a vicinity of the observation window 14, and includes, for example, a spectroscope on which light-emission of the plasma inside the chamber 4 is incident through the observation window 14, and a photoelectric element measuring intensity of light after spectral diffraction. The OES detector 21 may be disposed in close vicinity to, or directly attached to the observation window 14. Besides, the light of the plasma inside the chamber 4 may be guided to the OES detector 21 via an optical fiber.

An output of the OES detector 21 is connected to the etching control device 31. The etching control device 31 performs a control of the chamber 4, and data processing by obtaining data of plasma emission. Here, a control part 41 having a CPU (Central Processing Unit), memories, and so on an input/output device 42 controlling an input/output of data, a display part 43 displaying data, and a storage device 44 storing data and programs are included in the etching control device 31.

The control part 41 performs a control of etching and a prediction process of an etching end point by executing a semiconductor manufacturing program stored in the storage device 44. Here, the control part 41 is functionally divided into an analyzer 51, a period determination part 52, a process control part 53, and a diagnosis part 54.

The analyzer 51 performs a nonlinear regression analysis of data of emission intensity of plasma to calculate a regression formula of a time change of the emission intensity. Further, the analyzer 51 calculates a residual sum of squares of the regression formula.

The period determination part 52 determines a period obtaining the emission intensity of the plasma. A collection period of data of the emission intensity is determined from, for example, a change of a sign of a time differentiation of the emission intensity of the plasma.

The process control part 53 performs a control of the control unit 2 such as a start and a finish of the etching.

The diagnosis part 54 determines a cause of an abnormal state, and gives instruction of required actions when some errors are detected in the emission intensity of the plasma.

Next, an etching method using the etching apparatus 1 is described.

Figure 2A:
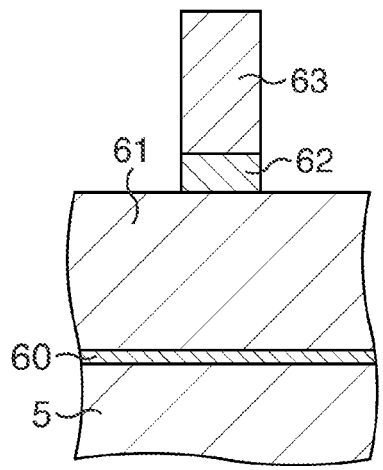
FIG. 2A is a view illustrating an example of a process object of the semiconductor manufacturing apparatus according to the first embodiment of the present invention.

At first, an example of an etching object is described with reference to FIG. 2A. The etching object is a polysilicon film 61 formed at upward of the silicon substrate 5 being the semiconductor wafer. The polysilicon film 61 is formed on a gate insulating film 60 on the silicon substrate 5. The gate insulating film 60 is formed for a thickness of several nm by performing thermal oxidation of a surface of the silicon substrate 5. The polysilicon film 61 is formed for a thickness of 200 nm by using, for example, the CVD method.

The polysilicon film 61 is patterned by an etching process to be a gate electrode. An SIO film 62 is therefore formed on the polysilicon film 61 before the etching is started. Further, a resist film is coated on the SIO film 62. A mask 63 is formed by patterning the resist film. Subsequently, the SIO film 62 is patterned by using, for example, $CF_4$ gas, $C_2F_6$ gas, $C_4F_8$ gas, phlorocarbon gas, and so on by a dry-etching apparatus. This dry-etching apparatus is preferable to be made up of the etching apparatus of the polysilicon film 61 performed subsequently and a multi-chamber capable of transferring while keeping the vacuum. Besides, the present embodiment may be applied for the dry-etching of the SIO film 62.

Subsequently, the etching process of the polysilicon film 61 is described with reference to a flowchart in FIG. 3.

Figure 3:
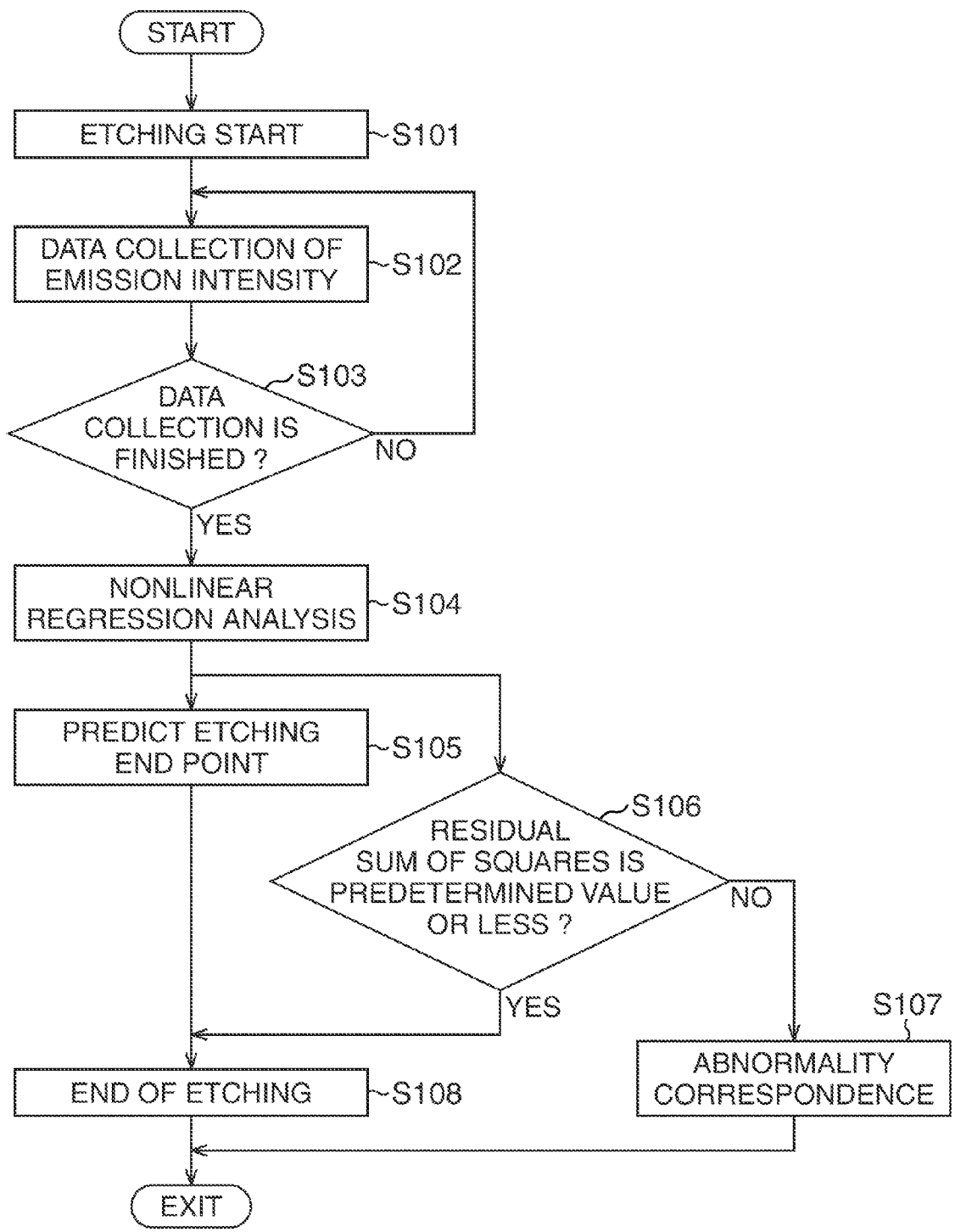
FIG. 3 is a flowchart illustrating an example of a manufacturing method of the semiconductor device according to the first embodiment of the present invention.

At first, the etching apparatus 1 starts the etching as illustrated in step S101 in FIG. 3. When the etching is performed, the silicon substrate 5 is carried into the chamber 4. The carrying in of the silicon substrate 5 is performed via a not-illustrated load lock. The silicon substrate 5 is positioned and placed on the lower electrode 8. Further, inside of the chamber 4 is depressurized to a predetermined degree of vacuum by using the exhaust unit 13. After that, etching gas is supplied from the gas supply unit 12 into the chamber 4. For example, there are mixed gas and so on of hydrogen bromide gas, oxygen gas, chlorine gas and so on as the gas used for the etching.

The process control part 53 applies an alternating voltage with high-frequency from the high-frequency power supply 11 between the upper and lower electrodes 8, 9 after a gas flow rate, the pressure in the chamber 4, the temperature of the silicon substrate 5, and so on are stabilized. Plasma is thereby generated at a space between the upper and lower electrodes 8, 9, and the etching of the polysilicon film 61 is started by being exposed to the plasma.

At subsequent step S102, the etching control device 31 collects data of the emission intensity. When the etching of the polysilicon film 61 is started, light-emission of the plasma occurs in the chamber 4. This light-emission is put into the OES detector 21 via the observation window 14 attached to the chamber 4. The OES detector 21 obtains the data of the emission intensity of light of a predetermined wavelength, and outputs to the etching control device 31. For example, there is a light with a wavelength of 200 nm to 300 nm resulting from a reactant Si as the wavelength put into the etching control device 31. Besides, there are a light with a wavelength of 400 nm to 450 nm resulting from a reactant $SiBr_x$, and a light with a wavelength of 600 nm to 800 nm resulting from a reactant Cl.

Figure 4:
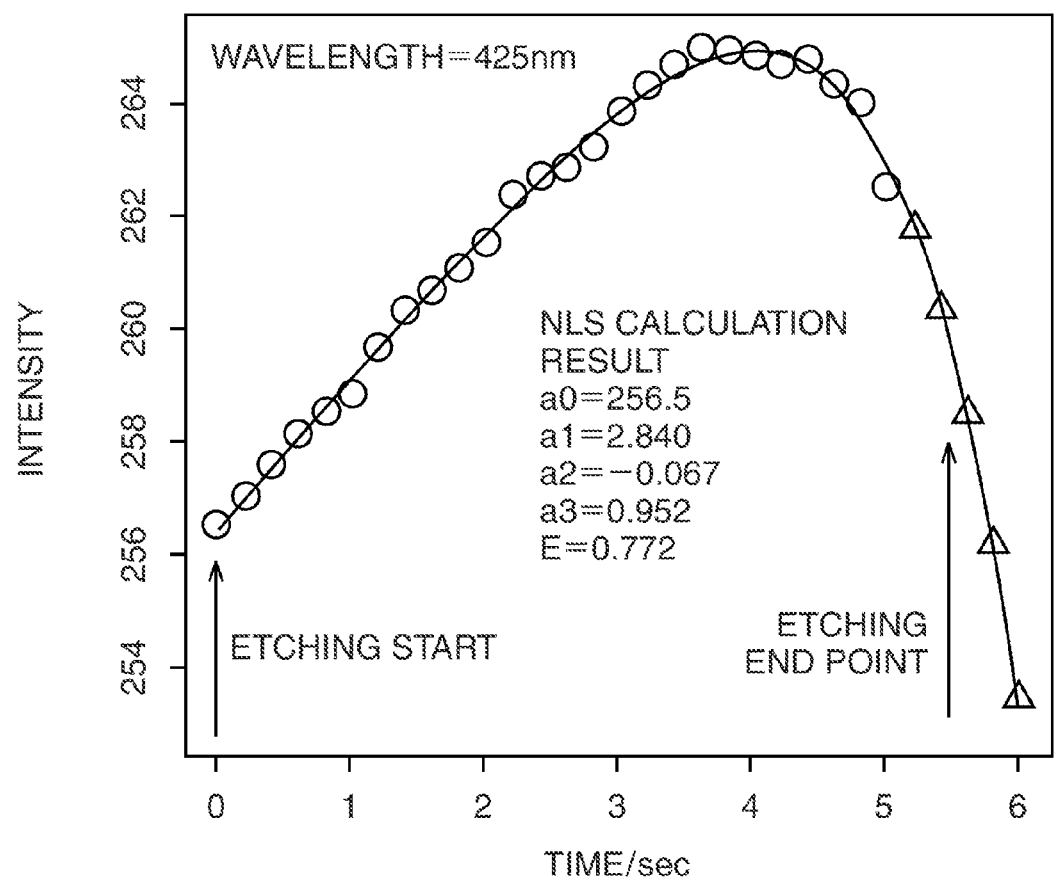
FIG. 4 is a graphic chart of a time change of emission intensity of plasma obtained by using the semiconductor manufacturing apparatus according to the first embodiment of the present invention.

As illustrated in step S103, the etching control device 31 collects the data of the emission intensity of the light until a predetermined data collection period elapses. The data is measured, for example, five times per second from the etching start time. A relationship between an etching process time and the emission intensity of the plasma is described with reference to FIG. 4. FIG. 4 is a graphic chart illustrating an example of a time change of the emission intensity of the light, and a horizontal axis thereof represents the time. A vertical axis represents the emission intensity, and round marks are actual measured values used for the nonlinear regression analysis. Triangle marks are actual measured values obtained after the nonlinear regression analysis. A curve is the one in which the regression formula obtained by the nonlinear regression analysis is made into a graph.

As illustrated in FIG. 4, the emission intensity of the plasma increases in accordance with an elapsed time at an initial stage of the etching. An increasing amount of the emission intensity decreases as the time elapses to have a peak after four seconds, and thereafter, the emission intensity decreases. The etching end point appears after the peak.

Here, a relationship between a progress of the etching and the emission intensity of the plasma is described with reference to FIG. 2A to FIG. 2E and FIG. 4.

The etching is not started when the process time is "0" (zero) second in FIG. 4. Namely, the polysilicon film 61 is not etched as illustrated in FIG. 2A.

Figure 2B:
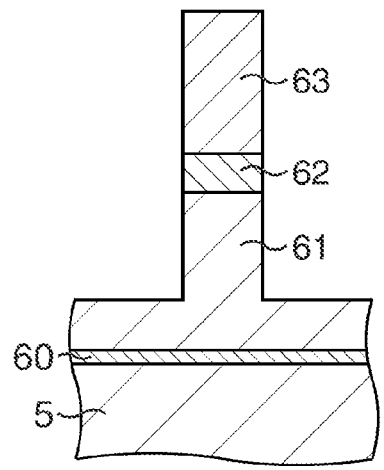
FIG. 2B is a view (part 1) illustrating an example of a process of the process object of the semiconductor manufacturing apparatus according to the first embodiment of the present invention.

When the process time is around two seconds in FIG. 4, the emission intensity increases in accordance with the passage of the process time. At this stage, the polysilicon film 61 is gradually etched from an upper part while using the resist film as a mask as illustrated in FIG. 2B. A relatively large part of the polysilicon film 61 is not etched.

Figure 2C:
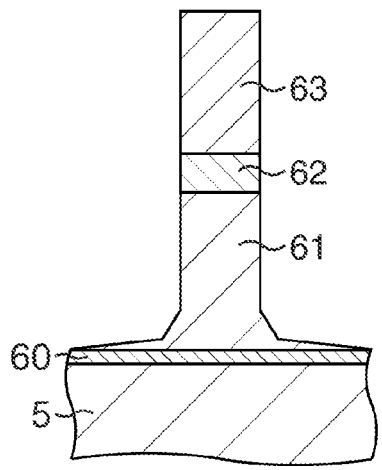
FIG. 2C is a view (part 2) illustrating an example of the process of the process object of the semiconductor manufacturing apparatus according to the first embodiment of the present invention.

When the process time is around four seconds in FIG. 4, the emission intensity becomes the peak. At this stage, the polysilicon film 61 is almost etched and remains a little at a bottom part and so on as illustrated in FIG. 2C.

Figure 2D:
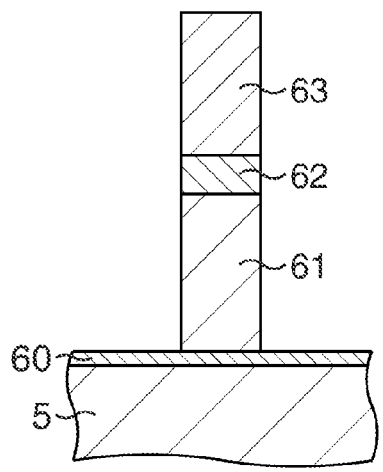
FIG. 2D is a view (part 3) illustrating an example of the process of the process object of the semiconductor manufacturing apparatus according to the first embodiment of the present invention.

When the process time is from five seconds to six seconds in FIG. 4, the etching is finished. At this stage, the polysilicon film 61 is removed by the etching except a masked area as illustrated in FIG. 2D. A width of the polysilicon film 61 remained by the mask becomes a desired size.

Figure 2E:
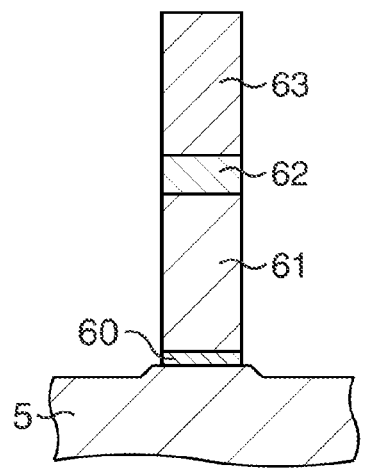
FIG. 2E is a view (part 4) illustrating an example of the process of the process object of the semiconductor manufacturing apparatus according to the first embodiment of the present invention.

Further, overetching occurs if the etching is continued up to over six seconds in FIG. 4. In this case, the gate insulating film 60 and the silicon substrate 5 under the polysilicon film 61 are etched as illustrated in FIG. 2E. Further, the etching of a sidewall of the polysilicon film 61 under the mask 63 proceeds, and a width of the gate electrode becomes narrow.

Accordingly, it is necessary to finish the etching before it becomes the overetching as illustrated in FIG. 2E. It is therefore necessary to predict the etching end point with high-accuracy.

Figure 2F:
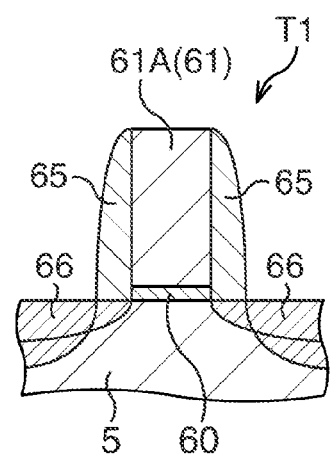
FIG. 2F is a view illustrating an example of a semiconductor element constituting a semiconductor device according to the first embodiment of the present invention.

Here, a gate electrode 61A is formed by etching the polysilicon film 61 as illustrated in FIG. 2F. Further, an impurity is ion-implanted to the silicon substrate 5 while using the gate electrode 61A as a mask. An insulating sidewall 65 is formed at each side part of the gate electrode 61A. Subsequently, the impurity is ion-implanted to the silicon substrate 5 again while using the insulating sidewall 65 and the gate electrode 61A as a mask. A source/drain area 66 is thereby formed at each side part of the gate electrode 61A. A transistor T1 being a semiconductor element is thereby formed on the silicon substrate 5. Further, a not-illustrated wiring layer is formed at upward of the silicon substrate 5, and thereby, a semiconductor device is formed.

Figure 5:
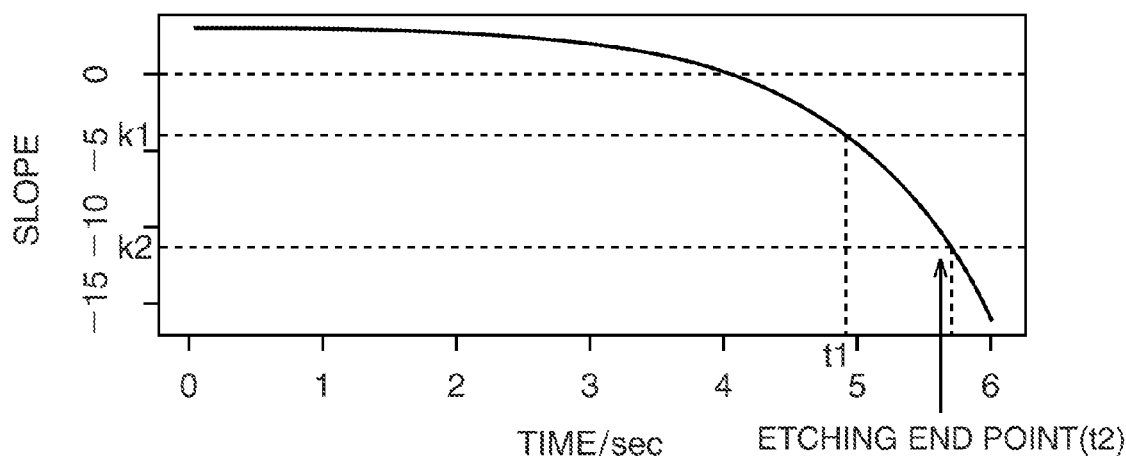
FIG. 5 is a graphic chart of a time differentiation of the emission intensity of the plasma obtained by using the semiconductor manufacturing apparatus according to the first embodiment of the present invention.

Further, the collection period of data required for the prediction of the etching end point is described with reference to FIG. 4 and FIG. 5. FIG. 5 illustrates a time change of a slope obtained by performing a time differentiation of the actual measured values of the emission intensity in FIG. 4. A horizontal axis represents the time and a vertical axis represents a value of the slope respectively.

The slope of the time change of the emission intensity of the plasma is plus just after the etching start time as illustrated in FIG. 5. After that, the slope decreases gradually, and it becomes minus after it passes zero when four seconds elapsed. The collection period of data in this embodiment is from the etching start time to a first time t1 when the slope comes into a minus area from the plus, passing through zero, and further reaches a minus value k1 defined in advance. The minus value k1 defined in advance is a value larger than a value k2 of the slope of the emission intensity at the etching end point. A reason why the collection period of data exceeds the peak of the emission intensity is to improve the accuracy of the nonlinear regression analysis. Further, a reason why the data collection is finished at a timing earlier than a timing reaching the etching end point is to predict the etching end point by using the collected data after finishing the nonlinear regression analysis.

The period determination part 52 calculates the slope of the time change of the emission intensity of the plasma. Further, the collection of data is finished when a sign of the slope changes from plus to minus to reach the value k1.

Here, the period determination part 52 may finish the data collection at the time when the slope of the change of the emission intensity of the plasma turns from plus to zero. Besides, it may finish the data collection at the time when the sign of the slope of the change of the emission intensity of the plasma changes from plus to minus. When the slope of the change of the emission intensity of the plasma changes between plus and minus including zero, the data collection period may be determined based on a timing when the slope continues to be zero or minus for the predetermined number of times.

At subsequent step S104, the analyzer 51 performs the nonlinear regression analysis (NLS) by using the collected data. A timing to start the nonlinear regression analysis is when the collection period of data determined by the period determination part 52 is finished.

It is conceivable that "dy/dt=cy" is applied in a vicinity of the etching end point when the "y" is the emission intensity of the plasma, the "t" is the process time, and the "c" is a coefficient. A general solution of this differential equation becomes an exponential function of the "t", and therefore, it is proper that an exponential function term of the "t" is included in the regression formula.

A model of the regression analysis is, for example, "$y=a_0+a_1 \times t + a_2 \times \exp(a_3 \times t)$". Here, the "y" represents the emission intensity of the plasma, and the "t" represents the process time. For example, the Newton's method and the patterning method is used for an algorithm of the nonlinear regression analysis, and each of the coefficients $a_0$, $a_1$, $a_2$, $a_3$, and a residual sum of squares E are calculated. The residual sum of squares E is calculated by:

$$E = \sum_{i=1}^{P} (x_i - x_{ei})^2 \qquad \text{[Expression 1]}$$

The "$x_i$" is an actual measured value. The "$x_{ei}$" is a predicted value, and the "p" represents the number of data. When a difference between the actual measured value "$x_i$" and the predicted value "$x_{ei}$" is large, the residual sum of squares becomes large, and there are possibilities that an abnormal state of the etching apparatus 1 and an abnormal value of the emission intensity occur.

In the example illustrated in FIG. 4, results in which $a_0=256.5$, $a_1=2.840$, $a_2=-0.067$, $a_3=0.952$, and the residual sum of squares E=0.772 are obtained. It is calculated that the relationship between the emission intensity and the process time is "$y=256.5+2.840 \times t - 0.067 \times \exp(0.952 \times t)$" from the calculation result of each of the coefficients "$a_0$", "$a_1$", "$a_2$", "$a_3$".

At subsequent step S105, the etching end point is determined by using this regression formula. The etching end point is a second time t2 when the emission intensity "y" decreases from a value at the peak time to a predetermined ratio.

Here, the etching end point may be set at a point when a predetermined time elapses from the peak time of the emission intensity "y". When the peak of the emission intensity "y" continues for a predetermined time, and then becomes flat, the etching end point may be determined based on a first time and emission intensity of the area which becomes flat, or the etching end point may be determined based on a last time and emission intensity of the area which becomes flat. The etching end point is determined by performances and so on of the etching apparatus 1.

At step S108, the process control part 53 finishes the etching when the process reaches the etching end point predicted by using the regression formula obtained from the nonlinear regression analysis. As illustrated in FIG. 4, the curve obtained from the regression formula and the actual measured values "triangle marks" of the emission intensity obtained after the nonlinear regression analysis are coincided with high-accuracy. It is therefore possible to predict the etching end point with high-accuracy according to the manufacturing method of the semiconductor device.

Figure 6:
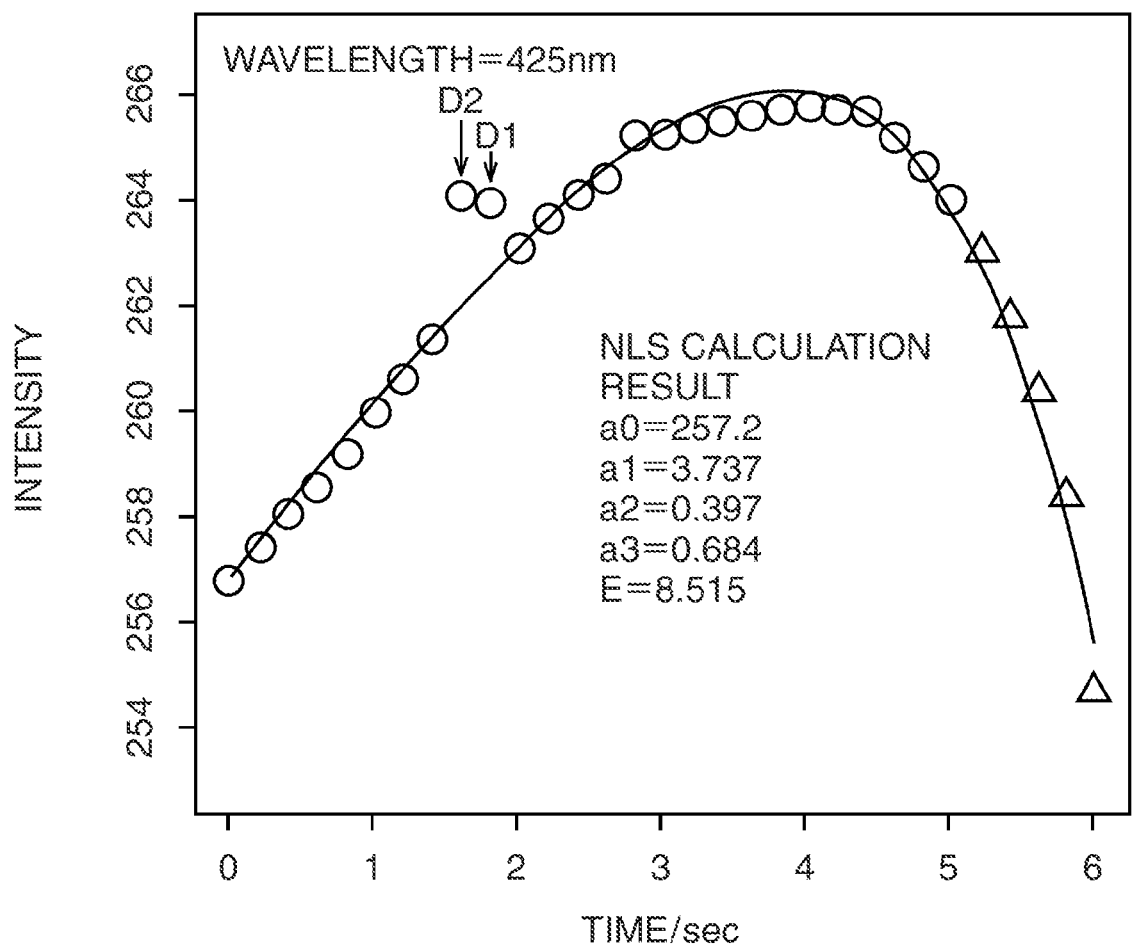
FIG. 6 is a graphic chart of a time change of the emission intensity of the plasma obtained by using the semiconductor manufacturing apparatus according to the first embodiment of the present invention.

On the other hand, at step S106 branching from the step S104, the analyzer 51 examines whether or not the residual sum of squares E is a predetermined value or less. Further, the diagnosis part 54 judges whether or not an abnormal state occurs in a plasma state such that arcing occurs during the etching by using the value of the residual sum of squares E. For example, the residual sum of squares E increases when a variation of the emission intensity caused by the arcing occurs at around two seconds from the etching start time as it is indicated by arrows D1, D2 in the graphic chart of the time change of the emission intensity in FIG. 6. The residual sum of squares when the arcing does not occur is approximately 0.772 as illustrated in FIG. 4, on the contrary, the residual sum of squares E increases to, for example, 8.515 in an example in FIG. 6. When the residual sum of squares E is the predetermined value set in advance or less ("No" at the step S106), the etching is continued. In this case, the etching is continued until the etching end point, and thereafter, the etching is finished at step S108.

On the other hand, when the residual sum of squares E exceeds the predetermined value ("Yes" at the step S106), the process proceeds to step S107 to perform abnormality correspondence. In the abnormality correspondence, for example, the process control part 53 stops the etching apparatus 1 based on an instruction of the diagnosis part 54 to interrupt the etching.

Besides, the occurrence of abnormal state is notified to an operator by sending out warnings and so on by using the input/output device 42 and the display part 43 based on the instruction of the diagnosis part 54. The operator takes a recovery action such as maintenance because there is a possibility in which some error occurs in the etching apparatus 1. There are methods in which the warnings are displayed on a control screen of the etching apparatus 1, a display lamp representing an apparatus state is lighted, an alarm is output, and so on as the method making contact with the operator when some errors are detected during the etching. Further, data notifying abnormality may be output and an electric mail may be sent to a central control room of a factory.

When it is possible to identify a cause of the abnormality of the etching apparatus 1 by the diagnosis part 54, an estimated cause of the abnormality is collectively notified. For example, a database in which a size of the residual sum of squares E, the value of the emission intensity of the plasma, and the causes of the abnormality of the etching apparatus 1 are associated is stored at the storage device 44, and the cause of the abnormality is identified by searching this database by the diagnosis part 54.

The diagnosis part 54 instructs an automatic restoration when the abnormality of the etching apparatus 1 is within a recoverable range. As a means of the automatic restoration, there are changes of an output of the high-frequency power supply 11, the pressure inside the chamber 4, the gas flow rate, and so on. On the other hand, the diagnosis part 54 instructs an action to suppress a damage to a minimum extent such as an emergency stop or a standby in an idling mode of the etching apparatus 1 from an analysis result, for example, an abnormal value of the residual sum of squares E, and so on when the cause of the error cannot be identified.

As it is described hereinabove, the etching end point is predicted by using the nonlinear regression analysis from the time change of the emission intensity of the plasma in this embodiment. It is thereby possible to predict the etching end point with high-accuracy. It becomes possible to predict the etching end point in advance, and therefore, the overetching caused by a process down and so on of data is prevented. The nonlinear regression analysis is calculated after the emission intensity of the plasma reaches the peak, and therefore, the accuracy of the regression formula can be improved.

Besides, the nonlinear regression analysis is used, and therefore, the etching end point can be predicted even when a part of data is lacked. Presence/absence of the abnormal value within the collected data can be judged by the size of the residual sum of squares E of the regression formula, and therefore, it is possible to improve the prediction accuracy of the etching end point. When the residual sum squares E is the predetermined value or more, it is possible to stop the etching, and to instruct the operator to take a necessary action. Accordingly, it is possible to find the abnormal state of the etching at an early time. Further, it is possible to rapidly recover the etching process.

Here, when the etching end point is determined by using a statistical method from past data as in a conventional way, there is a case when the regression formula derived from the past data cannot be applied when the state of the etching apparatus changes with time caused by accumulation of the number of processes of the semiconductor wafers, and when parts are replaced. In this case, it is necessary to newly obtain the data for statistical process.

Figure 7A:
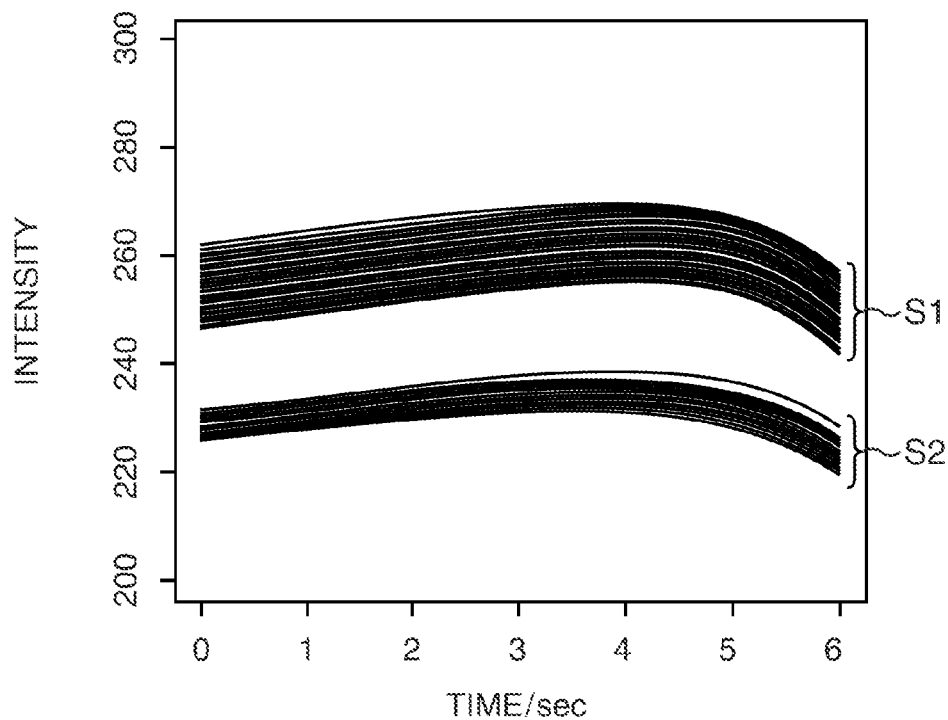
FIG. 7A is a graphic chart of a time change of the emission intensity of the plasma before maintenance of the semiconductor manufacturing apparatus according to the first embodiment of the present invention.
Figure 7B:
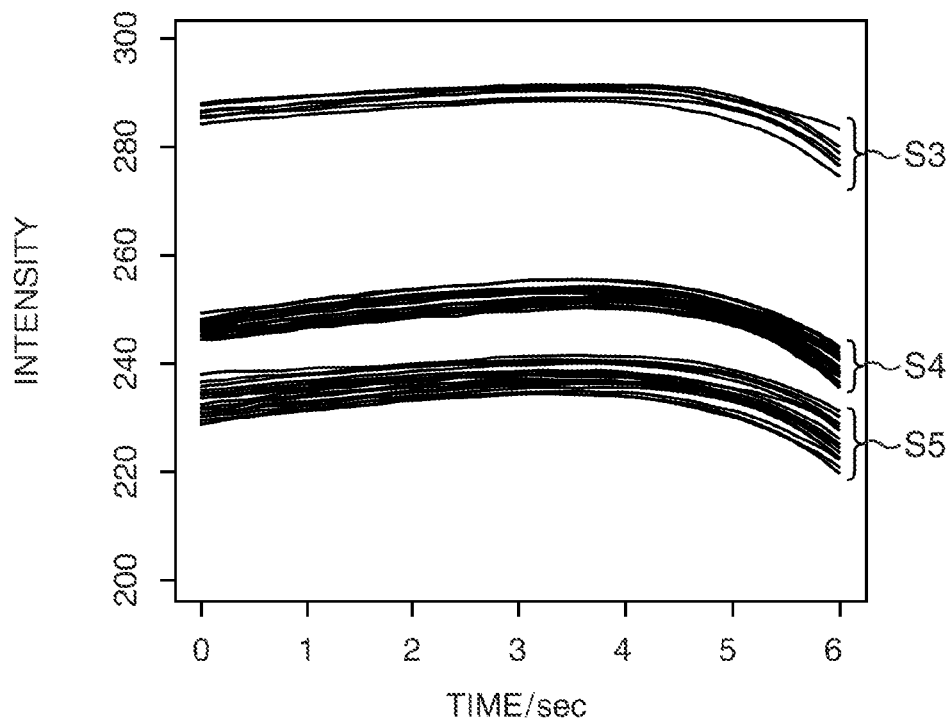
FIG. 7B is a graphic chart of a time change of the emission intensity of the plasma after maintenance of the semiconductor manufacturing apparatus according to the first embodiment of the present invention.

On the other hand, results are illustrated in FIG. 7A and FIG. 7B when the nonlinear regression analyses are performed for plural sorts. In FIG. 7A, the nonlinear regression analyses are performed for two sorts by using the etching apparatus before maintenance, and results when total 77 pieces of silicon substrates 5 are processed are represented. In FIG. 7B, the nonlinear regression analyses are performed for three sorts by using the etching apparatus after maintenance, and results when total 62 pieces are processed are represented. The nonlinear regression analysis after the maintenance illustrated in FIG. 7B is performed by using the regression formula before the maintenance. A horizontal axis represents the time and a vertical axis represents the emission intensity in each of FIG. 7A and FIG. 7B.

In a sort S1, a sort S2 illustrated in FIG. 7A, the actual measured value of the emission intensity of the plasma coincides with the regression formula with high-accuracy. Besides, as illustrated in FIG. 7B, when the emission intensities of the plasma are calculated by using the same regression formula as for sorts S3, S4, S5 while changing coefficients after the same etching apparatus 1 is maintained, they coincide with the actual measured values with high-accuracy.

It is possible to use the same regression formula before and after the maintenance as long as the apparatus is the same etching apparatus 1 from the result as stated above. It turns out from the above that it is not necessary to recalculate the regression formula every maintenance time. Different values are calculated by each sort as for the coefficients of the regression formula. In this embodiment, it is possible to predict the etching end point by using the regression formula of the same model only by changing the coefficients even for the different sorts.

Second Embodiment

A second embodiment is described with reference to the drawings.

There are plural emission wavelengths of plasma generated during an etching, and therefore, there is a case when a prediction of an etching end point is difficult depending on a selection of the wavelength of which data are to be collected. In this embodiment, the etching is controlled by measuring plasma emission with plural wavelengths and selecting a wavelength optimum for the prediction of the etching end point.

A schematic configuration of an etching apparatus 71 is illustrated in FIG. 8. The etching apparatus 71 includes the process unit 2 and a control unit 3A. The control part 41 of the control unit 3A is functionally divided into the analyzer 51, the period determination part 52, the process control part 53, the diagnosis part 54, and a wavelength selection part 55.

The analyzer 51 performs the nonlinear regression analysis by using data of emission intensities of plural wavelengths. Besides, the analyzer 51 calculates the residual sum of squares E as for each of the plural wavelengths.

The wavelength selection part 55 compares values of the residual sums of squares E by each wavelength, and selects the wavelength predicting the etching end point as a wavelength of which residual sum of squares E becomes minimum. A prediction accuracy of the etching end point is thereby improved. Besides, the wavelength selection part 55 may select from the wavelengths of which residual sums of squares E become a predetermined value or less.

Figure 9:
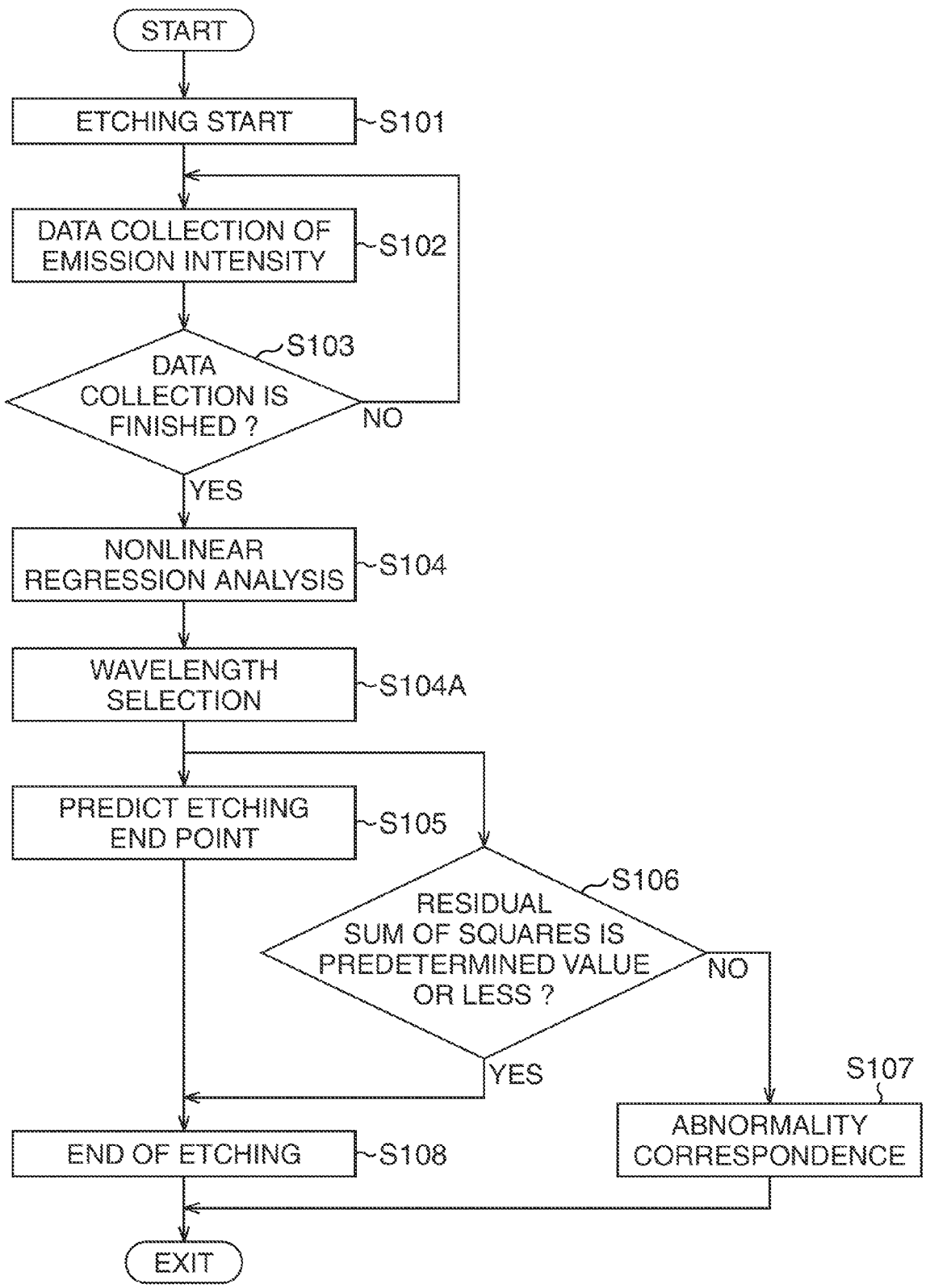
FIG. 9 is a flowchart illustrating an example of a manufacturing method of a semiconductor device according to the second embodiment of the present invention.

As illustrated in a flowchart in FIG. 9, the etching apparatus 71 starts the etching at step S101. Data of emission intensity are collected at steps S102 and S103. At this time, the data collection is performed for light with plural wavelengths generated inside the process unit 2. At step S104, the nonlinear regression analysis is performed as for each of the data of the plural wavelengths. At step S104A, the wavelength used for the prediction of the etching end point is selected from the plural wavelengths. At step S105, the etching end point is predicted by using the regression formula of the selected wavelength. Besides, at step S106, the residual sum of squares E is examined. When the residual sum of squares E is a predetermined value or less, the etching is finished at the predicted etching end point. On the other hand, when the residual sum of squares E exceeds the predetermined value, the etching is finished or etching conditions are changed. Besides, warnings are sent out according to need.

Here, the nonlinear regression analysis at the step S104 and the wavelength selection at the step S104A are described in detail.

Figure 10A:
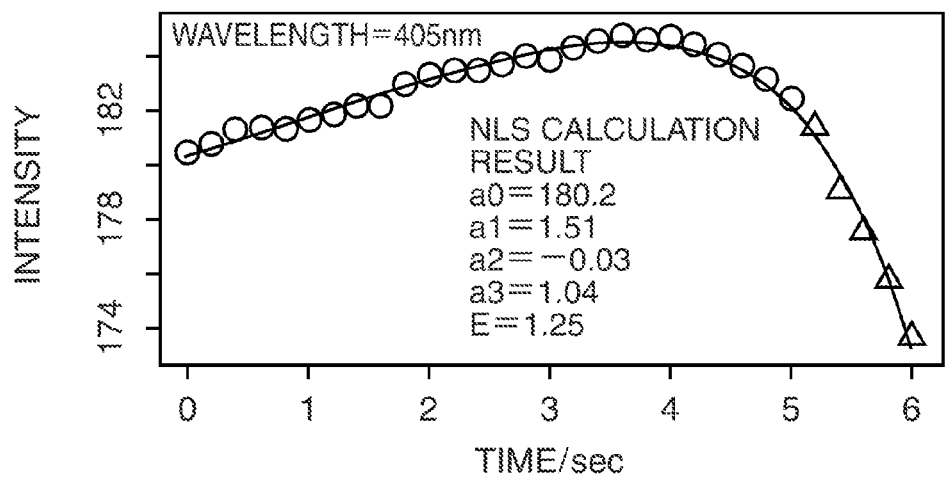
FIG. 10A is a graphic chart of a time change of emission intensity of plasma with a wavelength of 405 nm obtained by using the semiconductor manufacturing apparatus according to the second embodiment of the present invention.
Figure 10B:
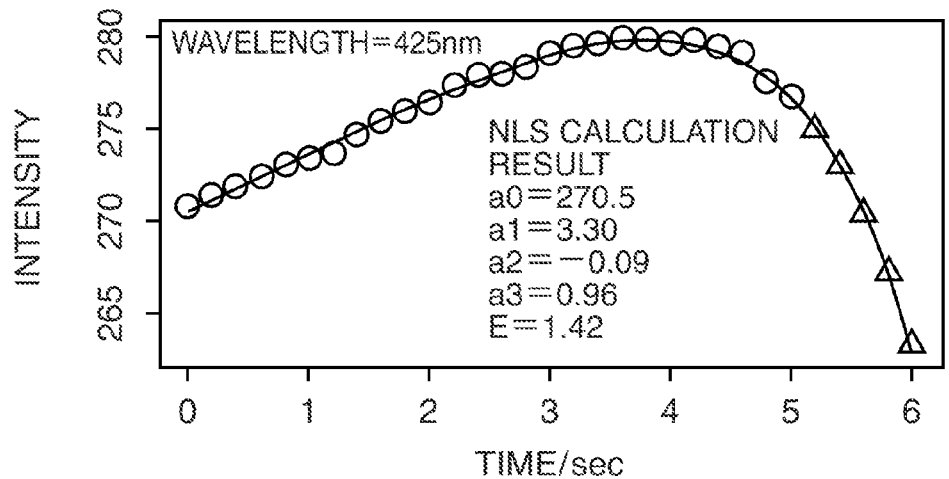
FIG. 10B is a graphic chart of a time change of emission intensity of plasma with a wavelength of 425 nm obtained by using the semiconductor manufacturing apparatus according to the second embodiment of the present invention.
Figure 10C:
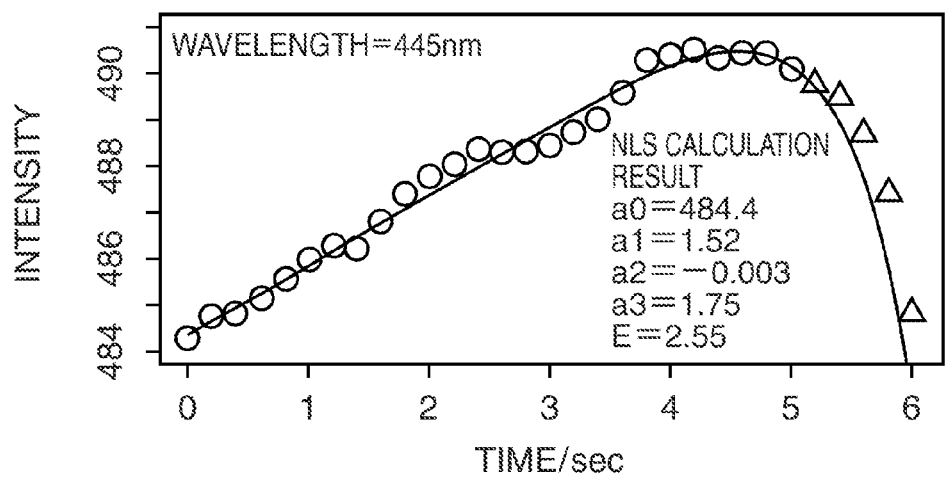
FIG. 10C is a graphic chart of a time change of emission intensity of plasma with a wavelength of 445 nm obtained by using the semiconductor manufacturing apparatus according to the second embodiment of the present invention.

At first, the emission intensities of the plasma of the plural wavelengths are simultaneously obtained. The wavelengths to be obtained are, for example, 405 nm and 445 nm in addition to 425 nm. An example of a graphic chart of the emission intensity of 405 nm and the process time is represented in FIG. 10A. An example of a graphic chart of the emission intensity of 425 nm and the process time is represented in FIG. 10B. Further, an example of a graphic chart of the emission intensity of 445 nm and the process time is represented in FIG. 10C.

A model of the regression analysis is set to be "$y = a_0 + a_1 \times t + a_2 \times \exp(a_3 \times t)$" for each of these three wavelengths, and each of the coefficients $a_0$, $a_1$, $a_2$, $a_3$, and a residual sum of squares E are calculated.

As illustrated in FIG. 10A, $a_0 = 180.2$, $a_1 = 1.51$, $a_2 = -0.03$, $a_3 = 1.04$, and the residual sum of squares $E = 1.25$ as a result of the nonlinear regression analysis performed for the wavelength of 405 nm.

As illustrated in FIG. 10B, $a_0 = 270.5$, $a_1 = 3.30$, $a_2 = -0.09$, $a_3 = 0.96$, and the residual sum of squares $E = 1.42$ as a result of the nonlinear regression analysis performed for the wavelength of 425 nm.

As illustrated in FIG. 10C, $a_0 = 484.4$, $a_1 = 1.52$, $a_2 = -0.003$, $a_3 = 1.75$, and the residual sum of squares $E = 2.55$ as a result of the nonlinear regression analysis performed for the wavelength of 445 nm.

Here, the residual sum of squares E of the light-emission with the wavelength of 445 nm is larger than the other two. This results in fluctuation of the plasma. The wavelength selection part 55 therefore selects the light-emission with the wavelength of 405 nm or the light-emission with the wavelength of 425 nm. The analyzer 51 predicts the etching end point by using the regression formula of the emission intensity of the plasma with the wavelength selected by the wavelength selection part 55.

In this embodiment, it is possible to select the emission wavelength of the plasma optimum for the prediction of the etching end point from among the plural wavelengths. Accordingly, it is possible to further improve the prediction accuracy of the etching end point.

Third Embodiment

A third embodiment is described with reference to the drawings.

An object of this embodiment is to predict the etching end point with high-accuracy even when data with an abnormal value is contained in the collected data.

Figure 11:
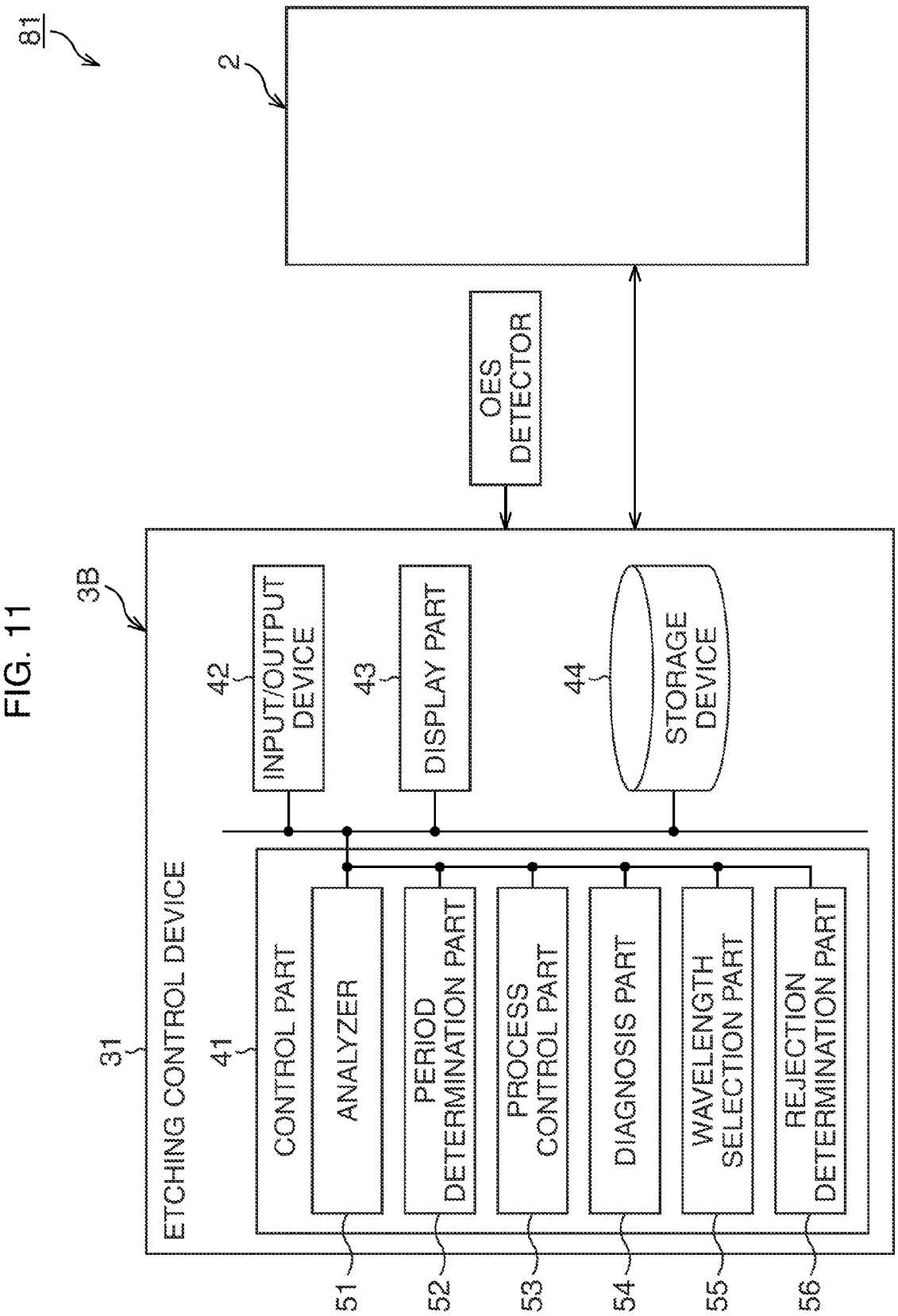
FIG. 11 is a block diagram illustrating an example of a semiconductor manufacturing apparatus according to a third embodiment of the present invention.

A schematic configuration of an etching apparatus 81 is illustrated in FIG. 11. The etching apparatus 81 includes the process unit 2 and a control unit 3B. The control part 41 of the control unit 3B is functionally divided into the analyzer 51, the period determination part 52, the process control part 53, the diagnosis part 54, the wavelength selection part 55, and a rejection determination part 56.

The analyzer 51 performs the nonlinear regression analysis by using the data of the emission intensities of the plural wavelengths, and calculates the residual sum of squares E. Besides, the analyzer 51 performs the nonlinear regression analysis and calculates the residual sum of squares for the data after a rejection test.

The rejection determination part 56 performs the rejection test for the collected data, and excludes an abnormal value and an outlier.

Figure 12:
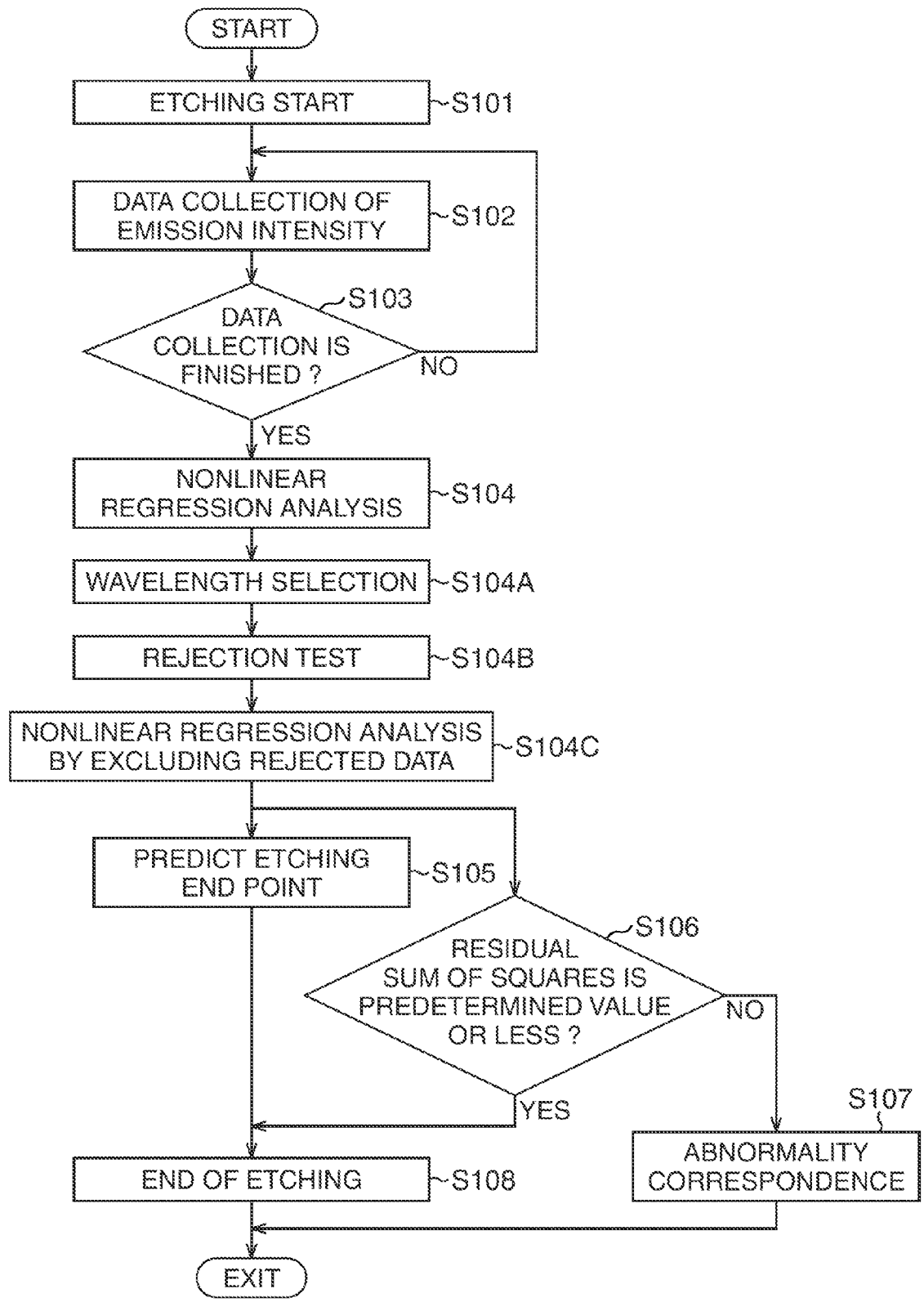
FIG. 12 is a flowchart illustrating an example of a manufacturing method of a semiconductor device according to the third embodiment of the present invention.

As illustrated in a flowchart in FIG. 12, the etching apparatus 81 starts the etching at step S101. Data of emission intensity are collected at steps S102 and S103. At this time, the data collection is performed for light of plural wavelengths. At step S104, the nonlinear regression analysis is performed for each of the data of the plural wavelengths. At step S104A, the wavelength used for the prediction of the etching end point is selected from among the plural wavelengths. At step S104B, the abnormal values or the outliers are excluded by using the rejection test. At subsequent step S104C, the regression formula is calculated by performing the nonlinear regression analysis again by using the data remaining after the rejection process. At step S105, the etching end point is predicted by using the regression formula. Besides, at step S106, the residual sum of squares E is examined. When the residual sum of squares E is a predetermined value or less, the etching is finished at the predicted etching end point. On the other hand, when the residual sum of squares E exceeds the predetermined value, the etching is finished or etching conditions are changed. Besides, warnings are sent out according to need.

Here, the rejection test at the step S104B is described in detail.

The rejection determination part 56 excludes a data of which residual is large by the rejection test. The residual is represented by, for example, "$e_i = x_i - x_{ei}$". Here, the "$e_i$" is the residual, namely, a difference between the actual measured value and the predicted value. The "$x_i$" is the actual measured value, and the "$x_{ei}$" is the predicted value. Further, a range of data which are rejected is as follows.

$$e_m \pm S_e \times \sqrt{\frac{N+1}{N}} \times t(N-1, \alpha) \qquad \text{[Expression 2]}$$

Here, the "$e_m$" is an average value of the residual "$e_i$", and the "$S_e$" is a standard deviation of the residual "$e_i$". Besides, the "$t(N-1, \alpha)$" represents a "t" value ("t" distribution) when a flexibility is "N−1", and a significant level is "$\alpha$".

Figure 13:
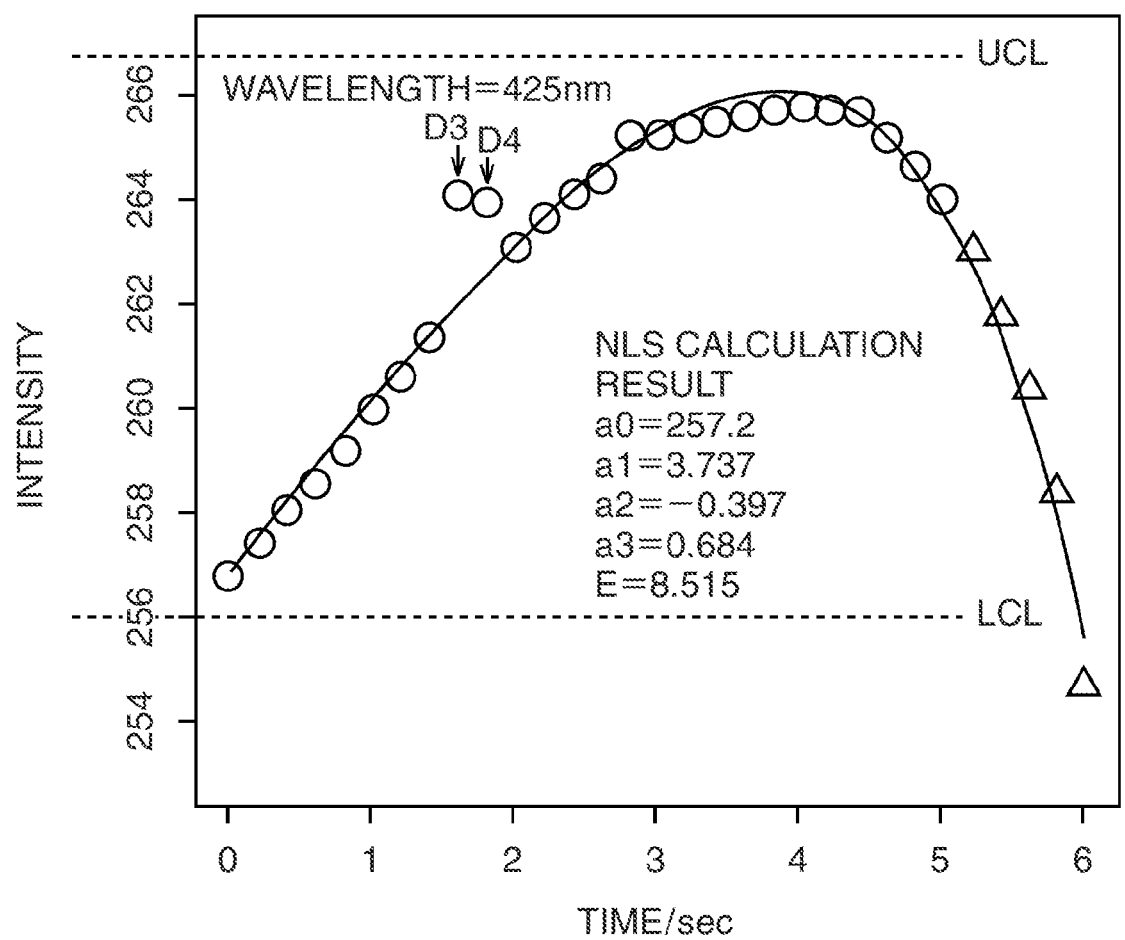
FIG. 13 is a graphic chart of a time change of emission intensity of plasma obtained by using the semiconductor manufacturing apparatus according to the third embodiment of the present invention.

For example, control limit lines (UCL: upper control limit line, LCL: lower control limit line) of the emission intensity of the plasma are conventionally defined in advance, and it is determined that an abnormal state of the plasma occurs when the emission intensity which is out of a range of the two control limit lines is observed, as an example illustrated in FIG. 13. In this case, it is impossible to identify the abnormal values and the outliers as indicated by arrows D3, D4. This is because the abnormal values are within a fluctuation band of normal values. Accordingly, the nonlinear regression analysis is performed without excluding the abnormal values and the outliers, and therefore, the etching end point cannot be predicted with high-accuracy. On the other hand, in this embodiment, the rejection determination part 56 excludes the data of abnormal light-emission as indicated by the arrows D3, D4. Further, the analyzer 51 predicts the etching end point again by performing the nonlinear regression analysis by using the data remained after the rejection test at the step S104C. Accordingly, the prediction accuracy of the etching end point is further improved.

Here, each embodiment is able to be used for a prediction of an end point of a process in the process having a profile in which a time change of data to be an index becomes convex toward downward.

Besides, processes of the flowcharts in FIG. 3, FIG. 9, FIG. 12 have parallel processes, but serial processes may be performed such that, for example, the step S106 is performed after the step S105, and thereafter the step S107 is performed.

The manufacturing method of the semiconductor device of each embodiment may be applied other than the etching of the thin film. For example, it is able to be applied for a prediction of an end point of polishing when a thin film formed at upward of a substrate is polished by the CMP method. In this case, a thickness of the thin film to be polished is detected by a sensor using interference of light. The sensor irradiates on a surface to be polished of the substrate through an optical window provided at a sand cloth. Further, the light reflected by the surface to be polished is input by a light-receiving element through the optical window. For example, when a Cu film formed on the substrate is polished, Cu is removed from a surface of the surface to be polished when the polishing of the Cu film is finished. As a result, light with a specific frequency is absorbed. A time change of an intensity of the light with the specific frequency is measured, a regression formula is found by the nonlinear regression analysis, and the end point of the polishing is predicted.

A program for causing a computer to execute the manufacturing method of the semiconductor device is included in each embodiment. Further, a storage medium such as a CD-ROM storing the program, and to store the program on the computer under a state capable of being downloaded are also included in each embodiment. A flexible disk, a hard disk, a magnetic tape, a magnetic optical disk, a nonvolatile memory card, and so on are applicable as the storage media in addition to the CD-ROM.

The regression formula is not limited to the one described in each embodiment. For example, it may be "$y=a_0+a_1 \times t+a_2 \times a_3\hat{}t$" ("^" is an exponentiation operator).

The etching end point is predicted by using the nonlinear regression analysis from the time change of the emission intensity of the plasma, and therefore, it is possible to detect the end point with high accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a semiconductor device, comprising:
   exposing an etching object to plasma and starting etching of the etching object;
   obtaining emission intensity of the plasma and determining a first time when a sign of a time differentiation of the emission intensity of the plasma changes;
   performing a nonlinear regression analysis by using the emission intensity of the plasma obtained up to the first time, and finding a regression formula of a time change of the emission intensity of the plasma;
   finding a second time finishing the etching from the regression formula after the first time; and
   finishing the etching at the second time.

2. The manufacturing method of the semiconductor device according to claim 1,
   wherein a case when the sign of the time differentiation of the emission intensity becomes minus for plural times is set to be the first time.

3. The manufacturing method of the semiconductor device according to claim 1,
   wherein "$y=a_0+a_1 \times t+a_2 \times \exp(a_3 \times t)$" is used as the regression formula when the "y" is set to be the emission intensity of the plasma, the "t" is set to be a process time, and respective coefficients are set be the "$a_0$", "$a_1$", "$a_2$", "$a_3$".

4. The manufacturing method of the semiconductor device according to claim 1, further comprising:
   finding a residual sum of squares by using a first value of the emission intensity of the plasma found from the regression formula and an actual measured value of the emission intensity of the plasma.

5. The manufacturing method of the semiconductor device according to claim 4, further comprising:
   sending out warnings when the residual sum of squares exceeds a second value.

6. The manufacturing method of the semiconductor device according to claim 5, further comprising:
   stopping an apparatus performing the etching when the warnings are sent out.

7. The manufacturing method of the semiconductor device according to claim 4, further comprising:
   obtaining the emission intensities of the plasma as for plural wavelengths; and
   determining the second time by using the emission intensity of the plasma of the wavelength having the lowest residual sum of squares found by each of the plural wavelengths.

8. The manufacturing method of the semiconductor device according to claim 1,
   wherein the nonlinear regression analysis is performed again after an actual measured value is deleted when a difference between the obtained actual measured value of the emission intensity of the plasma and a calculated value of the emission intensity of the same time found from the regression formula is larger than a first range.

9. The manufacturing method of the semiconductor device according to claim 8,
   wherein a rejection test is used for the deletion of the actual measured value.

10. The manufacturing method of the semiconductor device according to claim 8,
    wherein the second time is calculated from the nonlinear regression analysis in which the actual measured value determined to be out of a tolerance is excluded.

11. A manufacturing method of a semiconductor device, comprising:
    obtaining a data changing with a process time up to a first time when a slope of the time change of the data reaches a fourth value;
    performing a nonlinear regression analysis by using the data after the data reaches a peak and finding a regression formula of a time change of the data;
    calculating a second time required for the data to decrease to a five value from a process start time via the peak by using the regression formula as an end point of a process; and
    finishing the process at the end point of the process.

* * * * *